(12) United States Patent
Matocha et al.

(10) Patent No.: US 7,589,360 B2
(45) Date of Patent: Sep. 15, 2009

(54) GROUP III NITRIDE SEMICONDUCTOR DEVICES AND METHODS OF MAKING

(75) Inventors: Kevin Sean Matocha, Rexford, NY (US); Vinayak Tilak, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 171 days.

(21) Appl. No.: 11/594,473

(22) Filed: Nov. 8, 2006

(65) Prior Publication Data
US 2008/0121927 A1    May 29, 2008

(51) Int. Cl.
*H01L 29/06* (2006.01)
(52) U.S. Cl. ............... 257/192; 257/194; 257/E29.246; 257/E29.249; 257/E29.255
(58) Field of Classification Search .................... 257/24, 257/192, 194, E29.246, E29.249, E29.255
See application file for complete search history.

(56) References Cited

U.S. PATENT DOCUMENTS

| | | | |
|---|---|---|---|
| 5,668,023 | A | 9/1997 | Goossen et al. |
| 2005/0040385 | A1 | 2/2005 | Craven et al. |
| 2005/0218414 | A1 | 10/2005 | Ueda et al. |
| 2005/0245095 | A1 | 11/2005 | Haskell et al. |
| 2006/0008941 | A1 | 1/2006 | Haskell et al. |
| 2007/0138506 | A1* | 6/2007 | Braddock ............. 257/192 |

FOREIGN PATENT DOCUMENTS

| | | |
|---|---|---|
| WO | WO 03/089695 A1 | 10/2003 |
| WO | WO 2004/061969 A1 | 7/2004 |
| WO | WO 2005/122232 A1 | 12/2005 |

OTHER PUBLICATIONS

P. Waltereit, O. Brandt, A. Trampert, H. T. Grahn, J. Menniger, M. Ramsteiner, M. Reiche & K. H. Ploog ; "Nitride semiconductors free of electrostatic fields for efficent white light-emitting diodes"; Nature, vol. 406 , Aug. 24, 2000,|www.nature.com ; pp. 865-868.

Matocha et al.; "Positive Flatband Voltage Shift in MOS Capacitors on n-Type GaN"; IEEE Electron Device Letters, vol. 23, No. 2, Feb. 2002; pp. 79-81.

V. Adivarahan et al.; "Planar Schottky Diodes on High Quality A-plane GaN"; The Japan Society of Applied Physics, vol. 42 (2003) Pt. 2, No. 10A; Oct. 1, 2003; pp. L 1136-L 1138.

Chakraborty et al.; "Nonpolar a-plane p-type GaN and p-n Junction Diodes"; Journal of Applied Physics, vol. 96, No. 8, Oct. 15, 2004; pp. 4494-4499.

* cited by examiner

*Primary Examiner*—Minh-Loan T Tran
(74) *Attorney, Agent, or Firm*—Patrick K. Patnode

(57) ABSTRACT

A device having an electrode-insulator layer-group III nitride layer structure, wherein an interface between the insulator layer and the group III nitride semiconductor layer lies along a non-polar plane of the group III nitride semiconductor layer is provided.

22 Claims, 6 Drawing Sheets

US 7,589,360 B2

GROUP III NITRIDE SEMICONDUCTOR DEVICES AND METHODS OF MAKING

BACKGROUND

The invention relates generally to group III nitride devices, and more particularly to group III nitride metal oxide semiconductor (MOS) devices.

Electronic devices based on wide bandgap semiconductors offer superior high voltage, high power, high temperature, and high frequency operation. Wide band gap group III nitride semiconductor materials include but are not limited to materials such as gallium nitride, aluminum nitride, and aluminum-gallium nitride materials. For example, gallium nitride (GaN) is a semiconductor material with a wide (3.4 eV) band gap and a high (2500° C.) melting point. GaN is a hard, mechanically stable material with large heat capacity. These properties make it especially suitable for use in a high-frequency, high-power device operated at a high temperature and/or under high-voltage conditions.

High-power metal-oxide-semiconductor field effect transistors (MOSFET) devices are desirable for various power electronic applications. GaN MOSFETs are currently being investigated because of their favorable properties. Gallium nitride based MOSFET devices can provide lower losses than silicon devices. Gallium Nitride based MOSFETs are also expected to have lower gate leakage and potentially higher reliability due to the larger conduction band offset between GaN and $SiO_2$.

Due to the relative ease of growing planar Ga-face C-planes, virtually all MOSFET GaN devices are grown parallel to the polar c-axis. Such devices typically exhibit shifts in device parameters with temperature.

Accordingly, a technique is needed to address problems due to shifts in device parameters with temperature in group III nitride semiconductor devices, such as GaN MOSFET devices.

BRIEF DESCRIPTION

Briefly, in accordance with aspects of the present invention, a group III nitride semiconductor device is presented. The group III nitride device includes an electrode-insulator layer-group III nitride layer structure, wherein an interface between the insulator layer and the group III nitride semiconductor layer lies along a non-polar plane of the group III nitride semiconductor layer is provided.

In accordance with further aspects of the present invention, a group III nitride MOSFET is presented. The MOSFET includes a source region, a drain region, a gate electrode, a gate dielectric layer, and a group III nitride semiconductor base layer. The base layer is disposed to have an interface with the gate dielectric layer along a non-polar plane of the base layer, and the MOSFET is configured to form a MOS channel along the interface during operation.

According to further aspects of the present invention, a method of fabricating a group III nitride MOSFET device is presented. The method includes forming a gate dielectric layer-group III nitride semiconductor layer interface, where the interface lies along a non-polar plane of the group III nitride semiconductor layer.

In accordance with still further aspects of the present invention, a method of operating a group III nitride MOSFET is presented. The method includes applying a voltage to power the MOSFET device and conducting carriers along a MOS channel formed at an interface of an insulator layer and a non-polar plane of a group III nitride semiconductor layer, wherein an operating temperature is greater than 150° C.

DRAWINGS

These and other features, aspects, and advantages of the present invention will become better understood when the following detailed description is read with reference to the accompanying drawings in which like characters represent like parts throughout the drawings, wherein.

Figure 10:
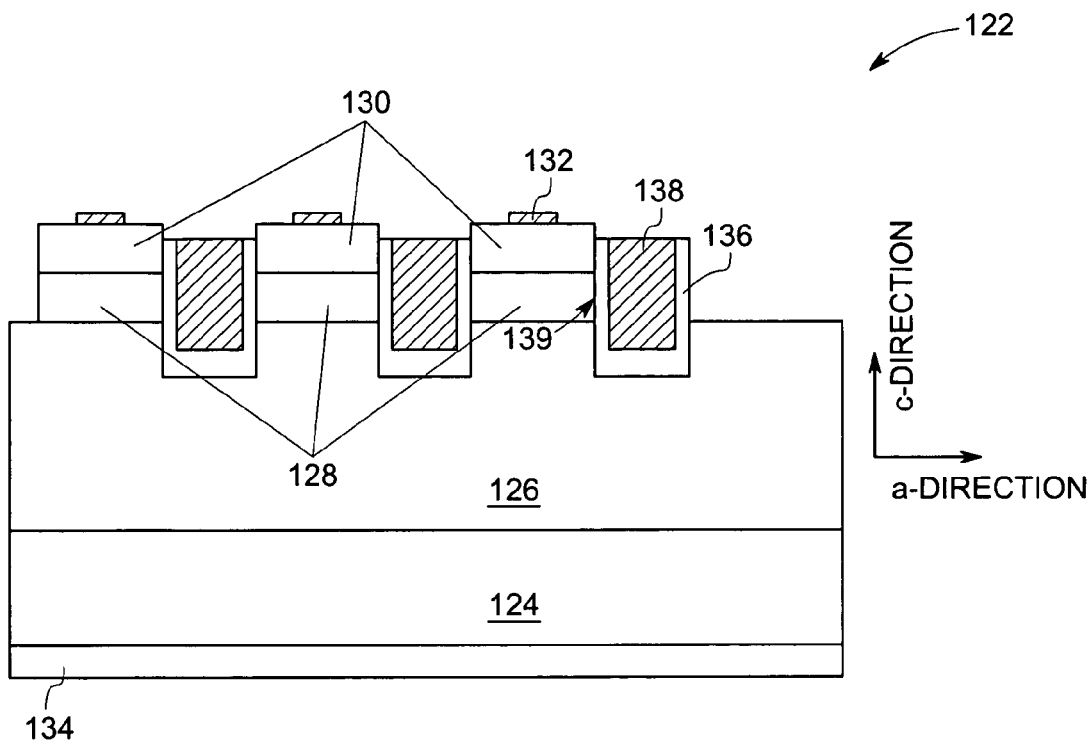
Figure 11:
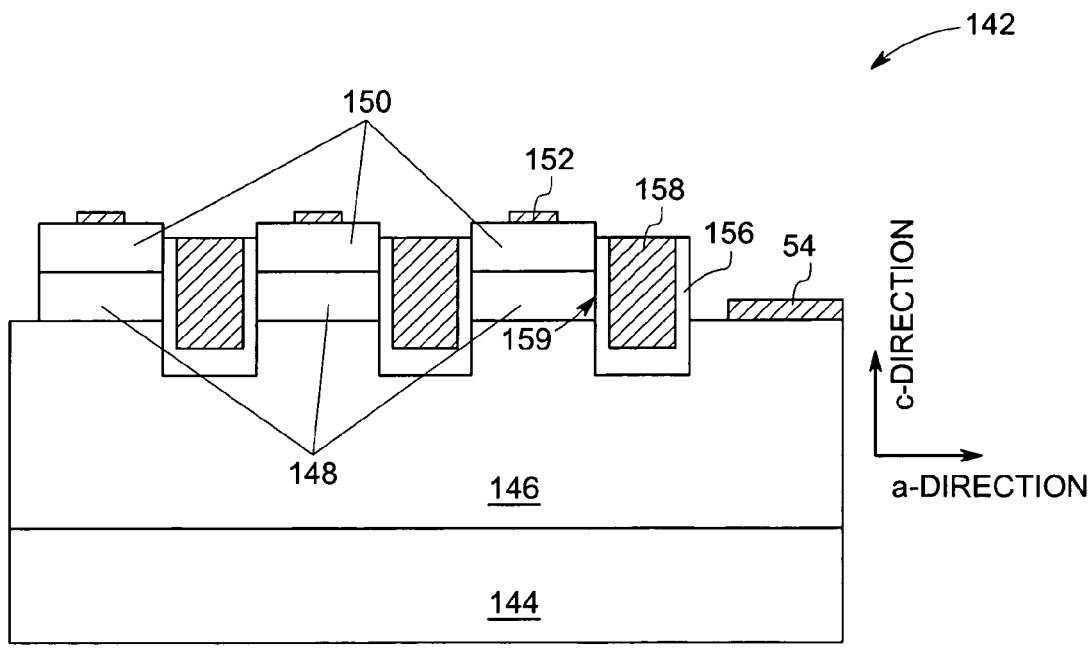

FIG. 10 is a cross-sectional representation of an exemplary embodiment of a vertical MOSFET with a metal oxide-semiconductor interface along the A-plane according to aspects of the present invention; and FIG. 11 is a cross-sectional representation of another exemplary embodiment of a vertical MOSFET with a metal oxide-semiconductor interface along the A-plane according to aspects of the present invention;

DETAILED DESCRIPTION

As described further below, embodiments of the present invention disclose devices including an electrode-insulator-group III nitride semiconductor layer structure, wherein the insulator-semiconductor layer interface lies along a non-polar plane of the semiconductor.

As used herein, the term "non-polar plane" refers to a plane within plus or minus 10 degrees off an ideal non-polar plane for a group III nitride.

As used herein, the terms, "oxide layer" and "insulator layer" are used interchangeably and refer to insulating layers, non-limiting examples of which include $SiO_2$ layers. Those skilled in the art will appreciate that while the terms may be used interchangeably herein, oxide is merely one example of an insulator that may be used. An example of a non-oxide insulator layer is a $SiN_x$ layer.

As used herein, the terms, "metal-oxide-semiconductor field effect transistor (MOSFET)", "metal-insulator-semiconductor field effect transistor (MISFET)", "insulated gate field effect transistor" (IGFET) all refer to devices having a gate electrode-insulator-semiconductor structure.

In one embodiment of the present invention, is a group III nitride semiconductor device. The group III nitride device includes an electrode-insulator layer-group III nitride layer structure, wherein an interface between the insulator layer and the group III nitride semiconductor layer lies along a non-polar plane of the group III nitride semiconductor layer. In one embodiment, the electrode-insulator layer-group III nitride semiconductor layer is for a capacitor structure. In one embodiment, the group III nitride semiconductor is GaN. In another embodiment, the group III nitride semiconductor is AlN.

Although the following description and representative examples describe GaN devices, the embodiments of the present invention are not limited to gallium nitride devices. Other group III nitride devices also fall within the scope of the invention. Non-limiting examples of group III nitrides include gallium nitride (GaN), aluminum nitride (AlN), indium nitride (InN), aluminum-gallium nitride (AlGaN) and indium-gallium-aluminum nitride (InGaAlN).

In a gallium nitride (GaN) wurzite crystal structure, as one proceeds from plane to plane along the c-direction (perpendicular to the C-plane), each plane will contain only one type of atom, either Ga or N. GaN crystals terminate with either only nitrogen atoms (the N-face or the (000 $\bar{1}$) direction) or with only Ga atoms (the Ga-face or the (0001) direction). As a consequence, GaN crystals are polarized along the direction of the c-axis, which is also referred to as spontaneous polarization. Additional polarization may be induced by strain of the crystal. This strain-induced polarization charge is referred to as piezoelectric polarization. The total polarization is a sum of the spontaneous and piezoelectric contributions.

The spontaneous polarization of these crystals is a bulk property and depends on the structure and composition of the crystal. Spontaneous polarization is temperature dependent, referred to as pyroelectric polarization or pyroelectricity. As temperature is increased due to pyroelectric effect, a flow of charge to and from the surfaces is induced. Pyroelectricity is the ability of certain materials to generate an electrical potential when they are heated or cooled. As a result of change in temperature, positive and negative charges move to opposite polar surfaces resulting in pyroelectric polarization of the crystal leading to the development of an electrical potential between the opposite ends. The property of pyroelectricity is the measured change in net polarization proportional to a change in temperature.

Figure 1:
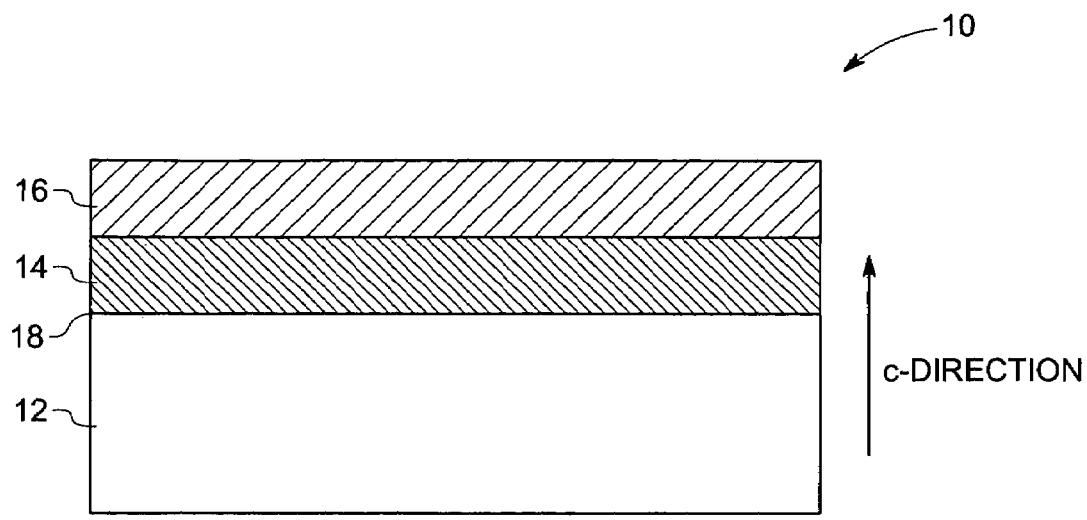
FIG. 1 is a cross-sectional representation of a MOS capacitor with a metal oxide-semiconductor interface along the C-plane.
Figure 2:
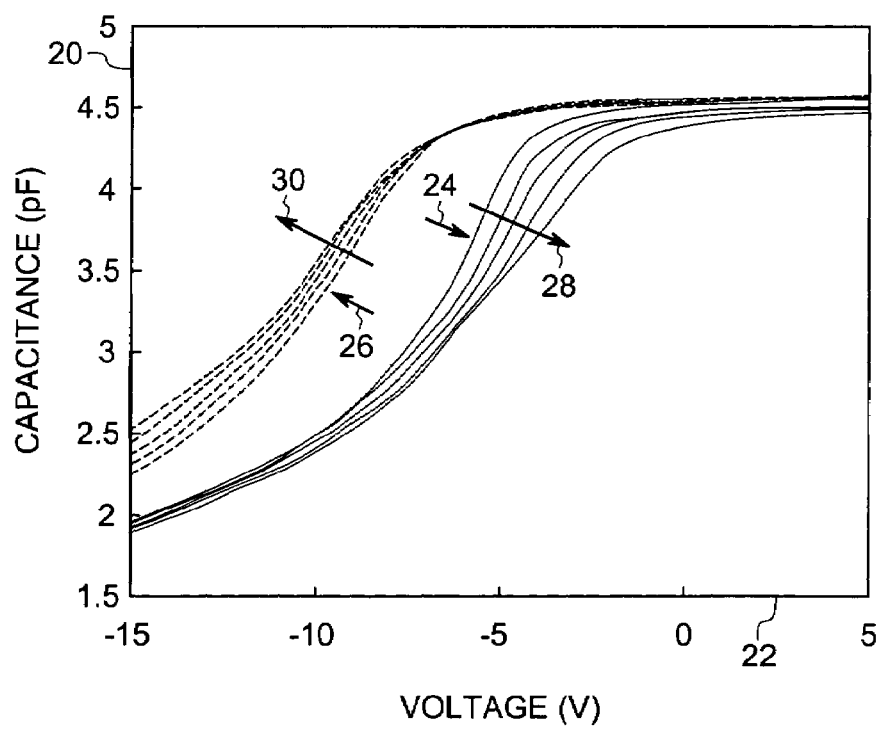
FIG. 2 is a graph illustrating the capacitance versus voltage profiles at 100 kHz for various temperatures for the C-plane MOS capacitor shown in FIG. 1 and for an M-plane MOS capacitor.

FIG. 1 is a cross-sectional representation of a MOS capacitor 10 fabricated and employed as a test sample, as described below with reference to FIGS. 2-4. The illustrated device 10 was formed by depositing a high temperature oxide (HTO) 14 of 150 nm thickness over a 16 μm thick C-plane GaN crystal substrate 12. FIG. 2 illustrates the variation in the measured capacitance (Y-axis 20) with voltage (X-axis 22) at 100 kHz for various temperatures for the C-plane MOS capacitor shown in FIG. 1 and for a similarly structured MOS capacitor manufactured on the M-plane. The M-plane MOS capacitor was formed by depositing an HTO layer of 150 nm thickness over a 500 μm thick M-plane GaN crystal substrate. A circular 160 μm diameter gate electrode was then formed over the HTO layer.

FIG. 2 shows the capacitance versus voltage profiles 24, and 26, for C-plane and M-plane respectively. Arrow marks 28 and 30 point along the direction of increasing temperatures, measured at temperatures 25° C., 50° C., 75° C., 100° C., and 125° C., for C-plane and M-plane respectively. The graph points to an increase in "flatband voltage" with increasing temperatures for the C-plane MOS capacitor. The voltage separating the accumulation and depletion regime is referred to as the flatband voltage. The positive flatband shift occurs when more negative charges are present at the GaN-oxide interface 18 with increasing temperature Although the applicants do not wish to be bound by any particular theory, it is believed that the increase in negative charges present at the GaN-oxide interface is a result of the change in surface polarization with temperature. In contrast, the M-plane profiles 26 point to a slight negative shift in the threshold voltage. This slight negative shift occurs due to changes in the bulk potential and due to the occupancy of interface-states, with no change in the surface polarization. In the case of a GaN MOSFET having an insulator-GaN semiconductor interface along a polar surface, this variation in surface polarization charge with temperature will likely cause large shifts in the threshold voltage with temperature.

Figure 3:
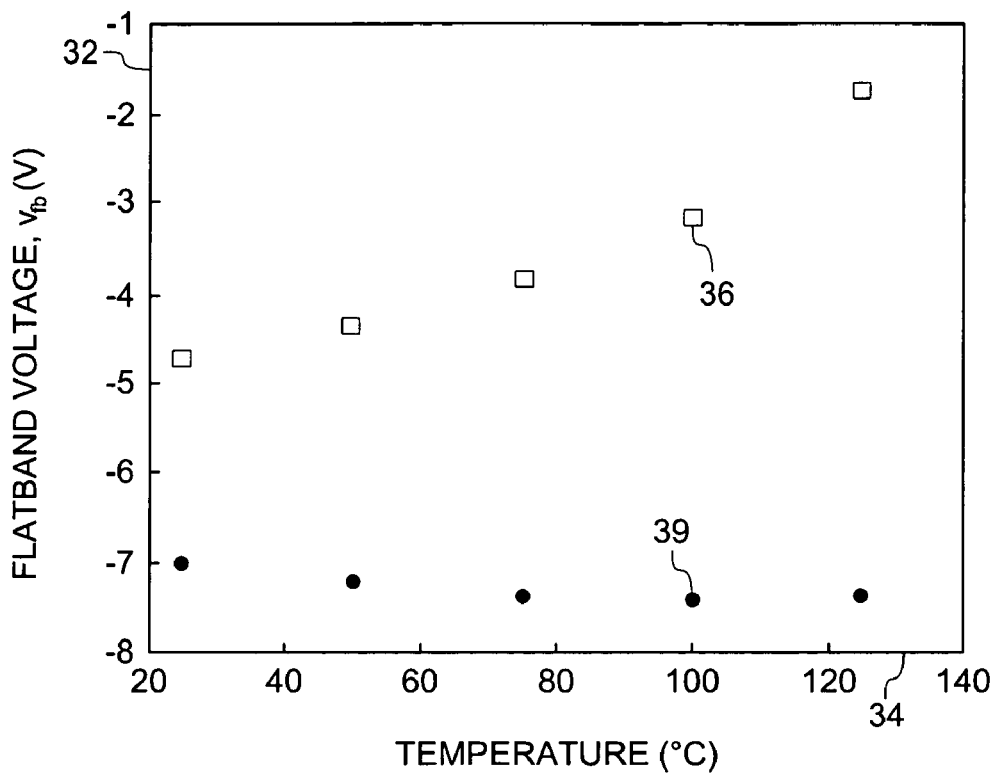
FIG. 3 is a comparative graph illustrating the flatband voltage versus temperature for the C-plane MOS capacitor shown in FIG. 1 and for an M-plane MOS capacitor.

FIG. 3 illustrates the variation in flatband voltage (Y-axis 32) with temperature (X-axis 34) for the C-plane MOS capacitor (scatter plot profile 36) and the M-plane MOS capacitor (scatter profile 39), extracted from FIG. 2. As can be observed from the plot, while the measured flatband voltage shift for the C-plane MOS capacitor is positive, for the M-plane, the effect of the change in bulk potential is to only slightly decrease the flatband voltage as discussed above.

Figure 4:
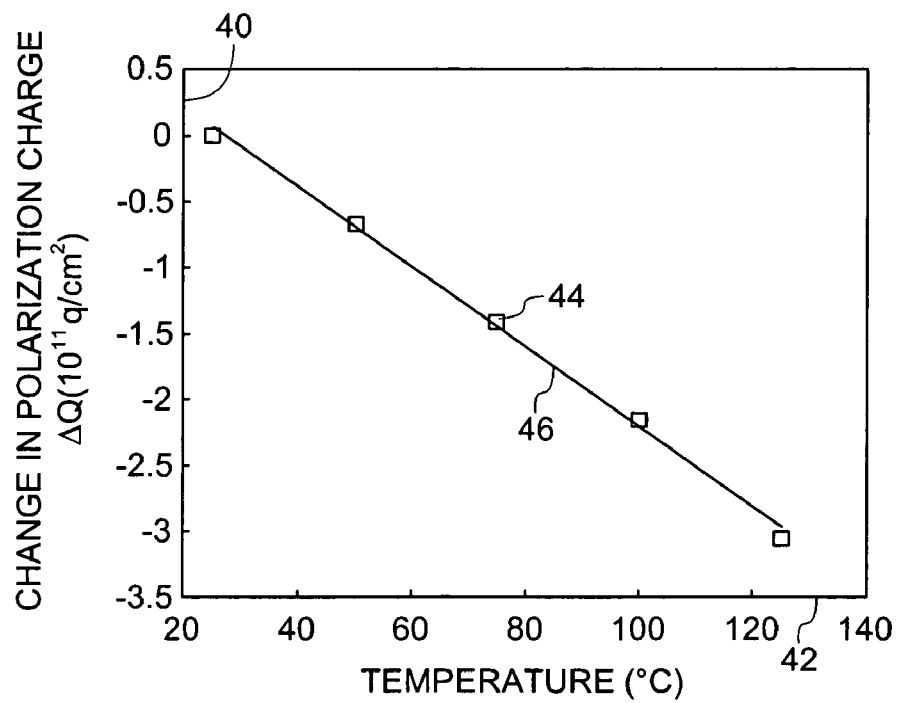
FIG. 4 is a graph illustrating the polarization charge versus temperature for the MOS capacitor shown in FIG. 1.

FIG. 4 illustrates the change in polarization charge $\Delta Q_{pol}$ (Y-axis 40) with temperature (X-axis 42) for the C-plane MOS capacitor shown in FIG. 1. $\Delta Q_{pol}$ is given by the product of the capacitance of the HTO layer $C_{ox}$ and the change in the flatband voltage with temperature $\Delta V_{FB}$. The scatter plot profile 44 indicates the experimentally measured polarization shift and line 46 indicates the linear fit to the data. The negative change in the polarization charge with temperature indicates the increasing negative charge at the C-plane GaN surface.

In accordance with one embodiment of the present invention, there is provided a semiconductor device including an electrode-insulator-GaN semiconductor layer structure, where the insulator-GaN semiconductor layer interface lies along a non-polar plane of the semiconductor. The non-polar planes of a GaN Wurzite crystal include the A and M planes of the crystal. In one embodiment, the interface lies along the A-plane of the semiconductor. In another embodiment, the interface lies along the M-plane of the semiconductor.

Figure 5:
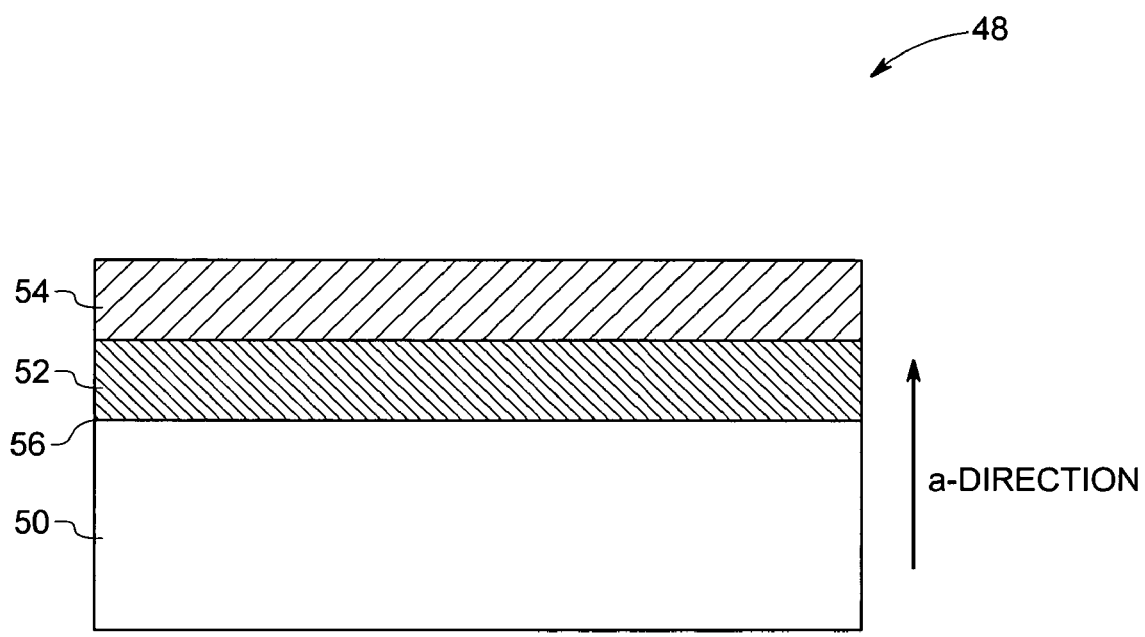
FIG. 5 is a cross-sectional representation of an exemplary embodiment of a MOS capacitor with a metal oxide-semiconductor interface along the A-plane according to aspects of the present invention.

Referring to FIG. 5, a first exemplary embodiment of a semiconductor device 48 is illustrated. In the illustrated embodiment, the semiconductor device 48 is shown to include a GaN semiconductor substrate 50, an insulator layer 52 disposed over the GaN semiconductor substrate along an A-plane and a metal layer 54 disposed over the insulator layer 52. In a non-limiting example, the insulator layer 52 is an oxide layer. In one embodiment, the semiconductor device 48 is a capacitor. The insulator-semiconductor interface lies along a non-polar plane (A-plane) of the GaN crystal. Advantageously, the device 48 experiences no significant change in device parameters such as threshold voltage upon increasing operating temperature.

Although the applicants do not wish to be bound by any particular theory, it is believed that because the insulator-semiconductor interface lies along a non-polar plane of the GaN crystal, and as the non-polar axis has no polarization charges, there can exist no polarization-induced shifts in the device parameters such as threshold voltage, leading to temperature stable operation of the device.

In accordance with another embodiment of the present invention is a MOSFET device having a gate electrode-insulator-group III nitride semiconductor layer structure, with an insulator-group III nitride semiconductor interface along a non-polar plane of the group III nitride semiconductor In one embodiment, the MOSFET includes a source region, a drain region, a gate electrode, a gate dielectric layer, and a base layer. The base layer is disposed to have an interface with the gate dielectric layer along a non-polar plane of the semiconductor layer, and the MOSFET is configured to form a MOS channel along the interface during operation. In one embodiment, the group III nitride semiconductor is GaN. In another embodiment, the group III nitride semiconductor is AlN.

As will be appreciated, a MOSFET further includes a source and a drain region in contact with the semiconductor layer. This semiconductor layer is referred to in the art as the body or base layer. As will be appreciated, upon application of a voltage to the gate electrode, current flows from the source to the drain. The gate voltage can be used to control the source to drain current. For an NMOSFET, where the source and drain are heavily n-doped, and the base layer is p-doped, when a positive gate to source voltage is applied, a channel with electrons as charge carriers (N-channel) is formed at the surface of the p-doped base region, under the insulator, at the insulator-semiconductor interface. This channel spreads from the source to the drain and provides conductivity of the transistor. When zero or negative voltage is applied between the gate and source, the channel disappears and no current flows between the source and the drain. For a PMOSFET, the source and drain are heavily p-doped, and the base layer is n-doped. When a negative gate to source voltage is applied, a channel with holes as charge carriers (P-channel) is formed at the surface of n-doped base region, under the insulator. This channel spreads from the source to the drain and provides conductivity of the transistor. When zero or positive voltage is applied between the gate and source, the channel disappears and no current flows between the source and the drain. The source is so named because it is the source of the charge carriers (electrons for N-channel, holes for P-channel) that flow through the channel. Conversely, the drain is where the charge carriers leave the channel. The gate controls the width of the channel and determines the extent to which the MOSFET conducts.

Although the following description illustrates various embodiments of NMOSFET devices, embodiments of the invention include corresponding PMOSFET devices as well.

In the embodiments of the present invention, during MOSFET operation, the channel, also referred to as the MOS channel, is formed along the non-polar plane. Because the MOS channel plane lies along the non-polar plane, no polarization charges are present to cause shift in device parameters, and hence temperature variations do not cause changes in device parameters such as threshold voltage. In one embodiment, the device is a gallium nitride (GaN) MOSFET formed on the A-plane of a GaN crystal substrate.

In one embodiment, the GaN MOSFET is fabricated on a non-polar axis of the GaN crystal. Since a non-polar axis has no polarization charge, there exist no polarization-induced shifts in the device parameters such as threshold voltage. By utilizing a non-polar axis of GaN, the MOSFET is rendered insensitive to polarization charges in contrast to devices fabricated on polar axes. In one embodiment, the device is a gallium nitride (GaN) MOSFET formed on the A-plane of a GaN crystal substrate.

Figure 6:
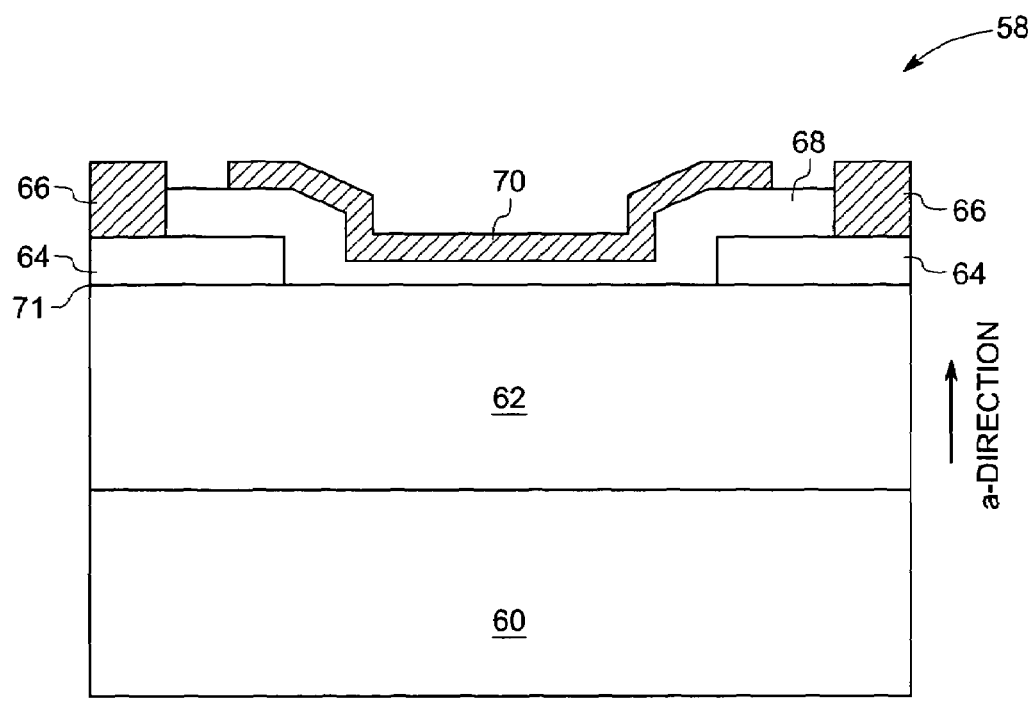
FIG. 6 is a cross-sectional representation of an exemplary embodiment of a lateral MOSFET with a metal oxide-semiconductor interface along the A-plane according to aspects of the present invention.

Referring to FIG. 6, an exemplary embodiment of a lateral NMOSFET device 58 is illustrated. A p-type GaN base layer 62 is disposed on a substrate layer 60. Suitable examples of substrate layer materials include, without limitation, GaN, SiC, Sapphire, and AlN. In one example, the p-type layer 62 is epitaxially-grown on the substrate 60. In one embodiment, a nucleation or buffer layer may be used between the substrate 60 and the p-type layer 62 to reduce the effect of lattice mismatch between the substrate and the p-type layer 62 during epitaxial growth. The p-type base layer 62 is grown such that the plane of the p-type GaN layer 62 lies along a non-polar plane such as the A-plane. Non-limiting examples of p-type dopants in the p-type GaN layer 62 include magnesium and calcium. In one embodiment, the p-type dopant concentration ranges from about $1\times10^{15}$ to about $1\times10^{18}$ $cm^{-3}$. In one embodiment, the thickness of the p-type layer is selected to be in a range from about 0.1 to about 10 microns.

To form the source and the drain, a heavily doped n-type GaN layer (n+GaN layer) is grown over the p-type layer 62. In a non-limiting example, the n+GaN layer is grown epitaxially over the p-type layer. The n-type dopant concentration ranges from about $1\times10^{17}$ to about $1\times10^{20}$ $cm^{-3}$. In some embodiments, the thickness of the n-type layer ranges from about 0.1 to about 2 microns. Non-limiting examples of n-type dopants include silicon and oxygen. After the growth of the n+GaN layer, a portion of the layer is removed, for example etched away, to form the source and drain 64. In some embodiments, source and drain regions may be formed by processes such as ion implantation.

An insulator layer 68, also referred to as the gate dielectric layer, is then deposited over the p-type base layer and at least part of the source and drain. In one embodiment, the gate dielectric layer thickness is in a range from about 10 nm to about 500 nm.

The gate electrode 70 is deposited over the gate dielectric layer 68. Non-limiting example of materials used to form the gate electrode include nickel, molybdenum, aluminum, gold, and polysilicon (which is typically doped after deposition). In one example, a photoresist layer may be used to pattern a gate electrode. In one embodiment, the thickness of the gate electrode 70 ranges from about 10 nm to about 2000 nm.

Source and drain ohmic contacts 66 are also formed over the source and drain 64. The deposition and formation of the source and drain contacts 66 may be achieved through conventional metallization and patterning techniques, as will be appreciated by one skilled in the art. In one embodiment, the metallization pattern of the contacts 66 is formed using standard techniques of masking and etching, in a sequential manner. In one embodiment, the patterning is through etching a portion of the insulator layer 68 and depositing metal contacts over the exposed source and drain regions 64. The metal contact 66 is then sintered and then the interconnects are added. In another embodiment, the conductive material to form the source and drain contacts 66 may be deposited using well known sputtering or chemical vapor deposition techniques, for example. Suitable contact materials include but are not limited to Ni, Ti, Al or an alloy of these. After deposition and patterning, the metal contacts are annealed at high temperature.

In one embodiment, the source and drain ohmic contacts 66 are formed with titanium-based metallization process and the contacts are subsequently annealed. Non-limiting examples of titanium-based materials used for forming ohmic contacts 66 include alloys such as Ti/Ni, Ti/Ni/Al/Au, Ti/Al/Pt/Au, and Ti/Al/Ti/Au. As will be appreciated, a passivation layer (not shown) may also be disposed over the above structure to protect the surface against mechanical forces and environmental contamination resulting from handling.

In the illustrated embodiment, during operation, the MOS channel is formed along non-polar plane semiconductor-gate dielectric interface 71. The device 58 is expected to exhibit temperature stable device parameters.

In some embodiments of the present invention, the n-type dopants used may include elements such as silicon, oxygen, or any combinations thereof. P-type dopants, which may be used in embodiments of the present invention, include magnesium, carbon, calcium, beryllium or any combinations thereof.

In some embodiments, the dopants could be introduced into the layers during the growth process. In one alternate embodiment, the doping may be performed through multiple lithography steps including a diffusion process whereby the respective dopants are diffused into the semiconductor layer/substrate selectively by making use of more than one masking layer. In another alternate embodiment, ion implantation may be employed to dope the semiconductor in part to form regions, such as source or drain regions, having a doping profile different from the underlying semiconductor layer.

Figure 7:
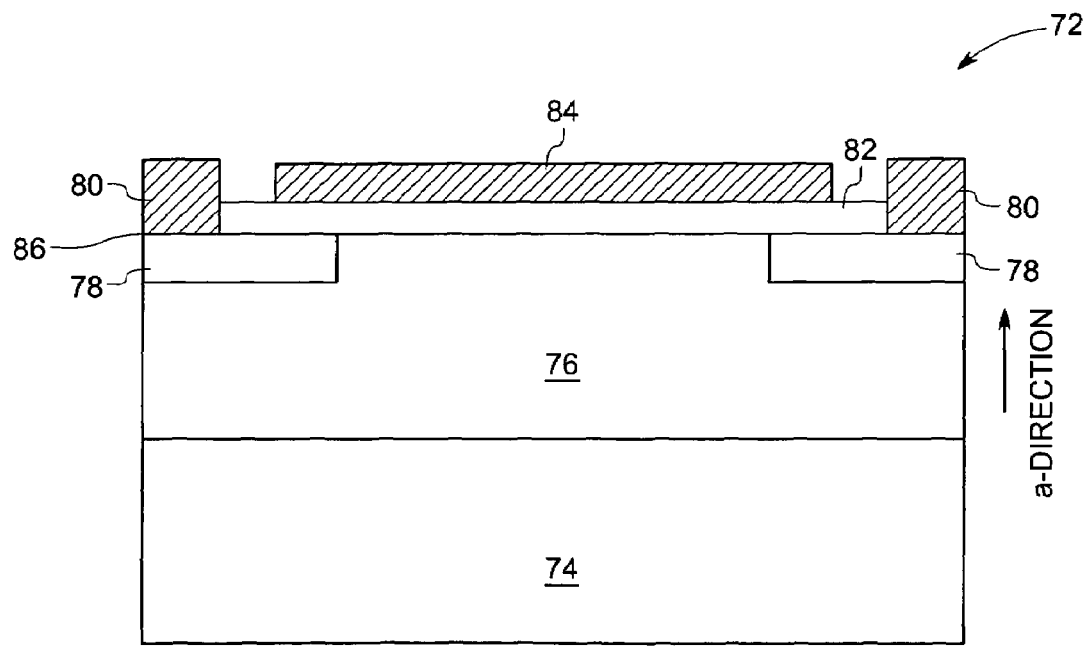
FIG. 7 is a cross-sectional representation of another exemplary embodiment of a lateral MOSFET with a metal oxide-semiconductor interface along the A-plane according to aspects of the present invention.

Referring to FIG. 7, an exemplary embodiment of a lateral NMOSFET device 72 is illustrated. A p-type GaN base layer 76 is disposed on a substrate layer 74. The p-type layer 76 is grown such that the plane of the p-type GaN layer 76 lies along a non-polar plane such as the A-plane.

The source and the drain 78 comprising heavily doped n-type regions are then formed. Suitable methods for forming source and drain regions 78 include ion implantation followed by annealing, or by selective regrowth, or by trench etching, epi-regrowth, followed by planarization. Suitable methods for planarization include chemical, mechanical or chemical-mechanical planarization.

In one embodiment, subsequent to the formation of source and drain regions 78, the source and drain regions 78 are subjected to high temperature. High temperature exposure after formation of the source and drain regions 78 may provide certain advantages. For instance, for the source and drain regions 78 formed by ion-implantation, exposure to high temperature enhances the electrical activation of ion-implanted species. In another example, source and drain regions 78 are formed by epitaxial growth, through a chemical vapor deposition technique for example. The epitaxial growth is performed at high temperature. Regardless of the formation techniques employed, high temperature processing is generally employed thereafter.

A gate dielectric layer 82, for example an $SiO_2$ layer, is then deposited over the p-type region. In one embodiment, the gate dielectric thickness is selected to be in a range from about 10 nm to about 500 nm. A gate electrode layer 84 is then deposited over the gate dielectric layer 82. In one embodiment, the gate electrode layer thickness is in a range from about 10 nm to about 2000 nm. The source and drain contacts 80 are deposited over the source and drain 78, respectively.

In accordance with one embodiment of the present invention is a MOSFET device including a RESURF (Reduced Surface Field) region. The use of a RESURF region enables additional field shaping near the gate.

Figure 8:
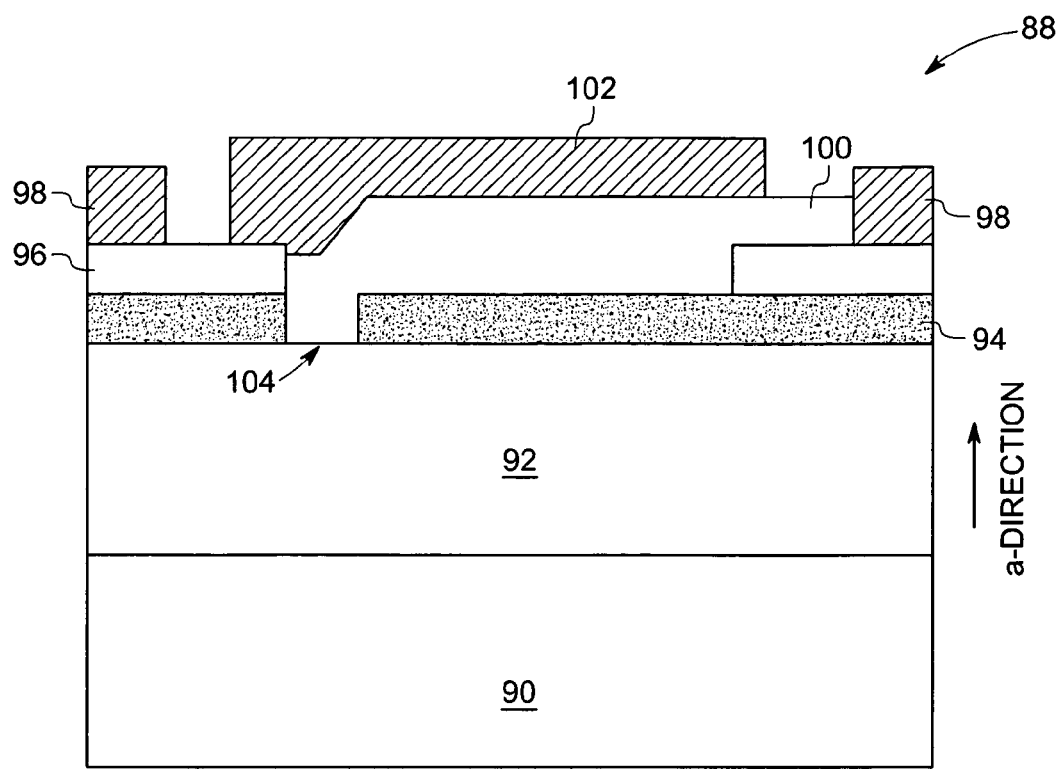
FIG. 8 is a cross-sectional representation of another exemplary embodiment of a lateral MOSFET with a metal oxide-semiconductor interface along the A-plane according to aspects of the present invention.

Referring to FIG. 8, an exemplary embodiment of a lateral MOSFET device 88 including a RESURF region is illustrated. A p-type base GaN layer 92 is disposed over the substrate 90. In one embodiment, the GaN base layer 92 is epitaxially grown, having a non-polar A-plane as the layer plane. In one embodiment, the layer thickness is in the range from about 0.1 to 50 microns and a dopant concentration in the range from about $1 \times 10^{15}$ to about $1 \times 10^{18}$ $cm^{-3}$.

An n-type RESURF region 94 is then disposed over the p-type base layer 92. In one example, the RESURF region 94 is formed by epitaxial growth. Non-limiting examples of n-type dopants used in the RESURF region 94 include oxygen and silicon. The net charge dose in the RESURF region 94 is in a range from about $1 \times 10^{12}$ to about $1 \times 10^{13}$ $cm^{-2}$. RESURF region 94 helps support high-voltage. In one embodiment, the length of RESURF region 94 is selected to be in a range from about 1 to about 50 microns. The longer the RESURF region 94, the higher the voltage the device can support.

Heavily doped n+GaN source and drain regions 96 are formed over the RESURF region 94. A recess is then etched through the n+source and drain regions 96 and the n-type RESURF region 94 in preparation for the deposition of the gate dielectric.

A gate dielectric 100 is then deposited and patterned to form a stepped structure. In one embodiment, the thickness of the gate dielectric layer 100 is in a range from about 10 nm to 3 microns. A gate electrode 102 is then disposed over the gate dielectric 100. In one embodiment, the source and drain ohmic contacts 98 are formed in a titanium-based metallization process as discussed above and then annealed. In the illustrated embodiment of FIG. 8, during operation, the MOS channel is formed along the non-polar plane semiconductor-gate dielectric interface 104. The device 88 is expected to exhibit temperature stable device parameters.

Figure 9:
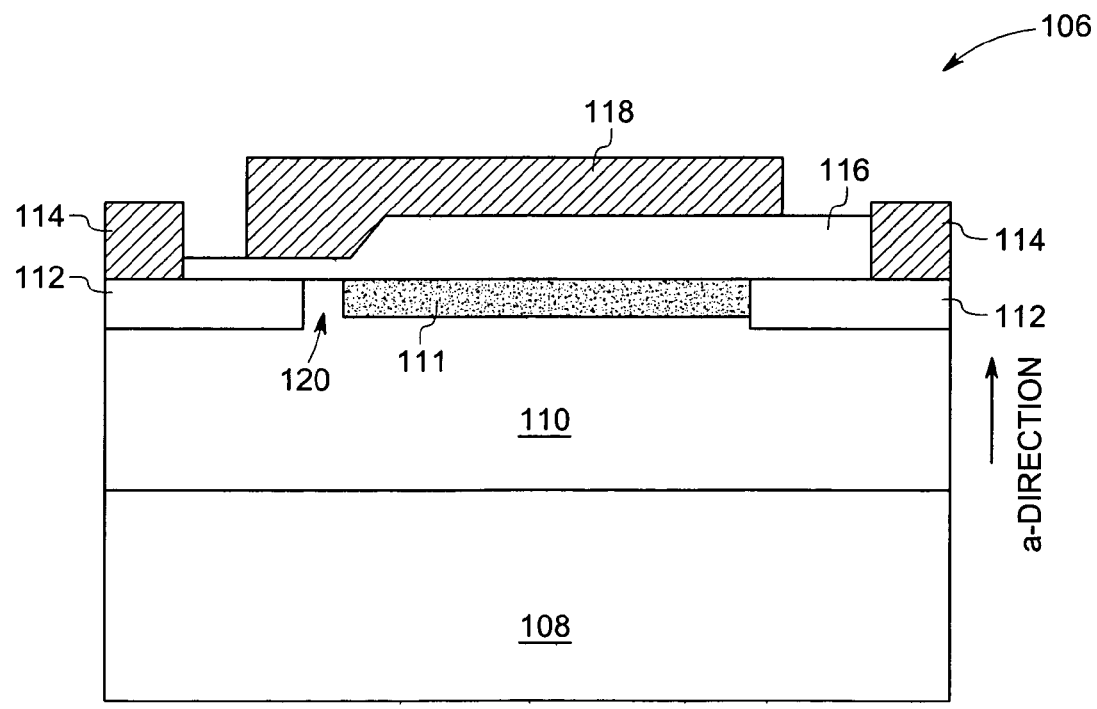
FIG. 9 is a cross-sectional representation of another exemplary embodiment of a lateral MOSFET with a metal oxide-semiconductor interface along the A-plane according to aspects of the present invention.

Referring to FIG. 9, another exemplary embodiment of a MOSFET device 106 including a RESURF region is illustrated. A P-type GaN base layer 110 is grown over a substrate 108 as in the embodiments described above. In one embodiment, the RESURF region 111 and the heavily doped n+GaN source and drain regions 112 are formed by implantation and annealing, or by selective regrowth, or by trench etching, epi-regrowth, followed by planarization. A gate dielectric material is then deposited and patterned to form a stepped gate dielectric structure 118. Source and drain contacts 114 are then formed to complete the device 106.

The input impedance of MOS devices is typically very high because of the insulator between the gate and the semiconductor channel. Because of the high input impedance, the gate leakage current is also very low. These qualities render the MOSFET highly desirable in power electronic applications. In one embodiment, a group III Nitride MOSFET of the present invention has a gate leakage current density less than about $1 \times 10^{-8}$ $A/cm^{-2}$ at about 6 Mv/cm electric field at room temperature.

In one embodiment, power MOSFETs advantageously have a vertical MOSFET structure with the source and drain formed at the top and bottom of the structure. The vertical scheme has the advantage of a large channel width and reduced field crowding at the gate. In one embodiment, the vertical MOSFET device includes a lightly doped drift layer, the doping concentration and thickness of which determines the source to drain voltage which can be applied. In one embodiment, a MOSFET of the present invention is operable at a temperature in excess of about 100 degrees Celsius. In a further embodiment, exemplary embodiments of the MOSFET of the present invention are operable at temperatures in excess of about 150 degree Celsius. In a still further embodiment the MOSFET of the present invention is operable at a temperature in excess of about 200 degree Celsius.

Referring to FIG. 10, an exemplary embodiment of a vertical MOSFET device is illustrated. In the illustrated embodiment, an n-type GaN drift layer 126 is disposed over a substrate 124. Non-limiting examples of substrates include GaN, AlN, Sapphire, and SiC substrates. In some embodiments, the n-type GaN drift layer 126 is epitaxially grown. In one embodiment, the non-polar plane is normal to the plane of the GaN drift layer growth direction. In the illustrated embodiment, the plane of growth of the GaN drift layer 126 is the C-plane and is polar. The A-plane is perpendicular to this plane. In one embodiment, the doping concentration is in a range from about $1\times10^{14}$ to $1\times10^{19}$ cm$^{-3}$. In another embodiment, the thickness of the n-type GaN layer 126 is in a range from about 0.1 to 50 microns. Non-limiting examples of n-type dopants include silicon and oxygen.

P-type and n-type regions 128 and 130, respectively, are formed over the n-type GaN layer 126. To form the p-type and n-type regions 128 and 130, in one example, a p-type layer is first deposited by epitaxy over the n-type GaN layer. In some embodiments, the dopant concentration in the p-type layer is in a range from about $1\times10^{15}$ to about $1\times10^{19}$ cm$^{-3}$ with a thickness in a range from about 0.05 to about 5 microns. In one embodiment, an n-type layer is further disposed over the p-type layer, for example by epitaxy. In some embodiments, the n-type layer has a dopant concentration in a range from about $1\times10^{17}$ to $1\times10^{20}$ cm$^{-3}$, and a thickness in range from about 0.1 to about 2 microns.

Vertical trenches are formed in the p-type and n-type layers to form the p-type and n-type regions 128 and 130, the base and source regions respectively. In one embodiment, the trenches or openings are about 1 micron to about 5 microns deep. The trenches or openings 15 are in a range of about 1 micron to about 20 microns wide.

Next, the gate dielectric layer material is deposited conformally across the sample. In one embodiment, the gate dielectric layer 136 has a thickness in a range from about 10 nm to 500 nm. Gate electrode material is then deposited and patterned to form the gate electrodes 138. Openings are formed at the top of the mesas of the n-type regions to deposit the source ohmic contacts 132. Layer 134 at the bottom of the substrate 124 forms the drain contact. During operation the MOS channel is formed along the interface 139.

Referring to FIG. 11, another exemplary embodiment of a vertical MOSFET device 142 is illustrated. In the illustrated embodiment, the MOSFET device structure includes an n-type GaN drift layer 146 is disposed over a substrate 144. Vertical trenches are formed in p-type and n-type epitaxial layers deposited over n-type GaN layer 146 to form the p-type and n-type regions, 148 and 150, the base and source regions respectively. Next, the gate dielectric layer 156 is deposited conformally across the trenches. Gate electrode material is then deposited and patterned to form the gate electrodes 158. Openings are formed at the top of the mesas of the n-type regions to deposit the source ohmic contacts 152. A drain contact 154 is also deposited on the same side of the device as the source contacts, and in contact with the n-type layer. During operation, the MOS channel is formed along the interface 159.

Another embodiment of the present invention resides in a method of operating of a group III nitride MOSFET MOSFET. The method includes powering a MOSFET device by applying a voltage between the source and drain contacts and the applying a voltage to the gate electrode, which enables conduction of carries along a MOS channel formed at an interface of an insulator layer and a non-polar plane of a GaN semiconductor layer. In one embodiment, the operating temperature of the MOSFET is greater than 150° C.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A semiconductor device comprising:
an electrode-insulator layer-group III nitride semiconductor layer structure, wherein an interface between the insulator layer and the group III nitride semiconductor layer lies along a non-polar plane of the group III nitride semiconductor layer.

2. The semiconductor device of claim 1, wherein the non-polar plane is an A-plane.

3. The semiconductor device of claim 1, wherein the non-polar plane is an M-plane.

4. The semiconductor device of claim 1, wherein the group III nitride comprises a material comprising GaN, AlN, InN or combinations thereof.

5. The semiconductor device of claim 1, wherein the device is a MOS capacitor.

6. The semiconductor device of claim 1, wherein the device is a MOSFET, wherein the group III nitride semiconductor layer is a base layer, and wherein the insulator layer is a gate dielectric layer.

7. The semiconductor device of claim 6, wherein a conduction plane of a MOS channel of the MOSFET during operation comprises the non-polar plane of the group III nitride semiconductor layer.

8. A group III nitride MOSFET comprising:
a source region;
a drain region;
a gate electrode;
a gate dielectric layer; and
a group III nitride semiconductor base layer, wherein the base layer is disposed to have an interface with the gate dielectric layer along a non-polar plane of the base layer, and wherein the MOSFET is configured to form a MOS channel along the interface and in the non-polar plane during operation.

9. The group III nitride MOSFET of claim 8, wherein the base layer is a non-polar plane group III nitride semiconductor layer.

10. The group III nitride MOSFET of claim 9, wherein the non-polar plane is an A-plane.

11. The group III nitride MOSFET of claim 8, wherein the MOSFET is a lateral MOSFET.

12. The group III nitride MOSFET of claim 11, wherein the MOSFET further comprises a non-polar plane substrate.

13. The group III nitride MOSFET of claim 12, wherein the substrate comprise a non-polar plane group III nitride crystal.

14. The group III nitride MOSFET device of claim 8, further comprising a RESURF region.

15. The group III Nitride MOSFET device of claim 8, wherein a gate leakage current density is less than $1\times10^{-8}$ A/cm$^{-2}$ at 6 MV/cm electric field at room temperature.

16. The group III nitride MOSFET of claim 8, wherein the MOSFET is a vertical-MOSFET.

17. The group III nitride MOSFET of claim 16, further comprising a drift layer, wherein the base layer is disposed over the drift layer.

18. The group III nitride MOSFET of claim 17, wherein the drift layer comprises a C-plane layer.

19. The group III nitride MOSFET of claim 17, further comprising a C-plane substrate, wherein the drift layer is disposed over the substrate.

20. The group III nitride MOSFET of claim 8, wherein the group III nitride comprises a material comprising GaN, AlN, InN, or combinations thereof.

21. The group III nitride MOSFET of claim 8, wherein the group III nitride comprises GaN.

22. The group III nitride MOSFET of claim 8, wherein the group III nitride comprises AlN.

* * * * *